US012808935B2

(12) United States Patent
Pabbu et al.

(10) Patent No.: US 12,808,935 B2
(45) Date of Patent: Nov. 24, 2026

(54) METHOD FOR ESTIMATING STATE OF CHARGE AND STATE OF HEALTH OF A BATTERY AND A SYSTEM THEREOF

(71) Applicant: SEDEMAC MECHATRONICS PVT LTD, Maharashtra (IN)

(72) Inventors: Suraj Kumar Pabbu, Telangana (IN); Amey P. Wadegaonkar, Maharashtra (IN); Anaykumar Joshi, Maharashtra (IN)

(73) Assignee: SEDEMAC MECHATRONICS PVT LTD, Maharashtra (IN)

( * ) Notice: Subject to any disclaimer, the term of this patent is extended or adjusted under 35 U.S.C. 154(b) by 516 days.

(21) Appl. No.: 18/020,004

(22) PCT Filed: Aug. 26, 2021

(86) PCT No.: PCT/IN2021/050823
§ 371 (c)(1),
(2) Date: Feb. 6, 2023

(87) PCT Pub. No.: WO2022/044046
PCT Pub. Date: Mar. 3, 2022

(65) Prior Publication Data

US 2023/0305067 A1 Sep. 28, 2023

(30) Foreign Application Priority Data

Aug. 28, 2020 (IN) ............................. 202021037245

(51) Int. Cl.
*G01R 31/367* (2019.01)
*G01R 31/3842* (2019.01)
*G01R 31/392* (2019.01)

(52) U.S. Cl.
CPC ....... *G01R 31/367* (2019.01); *G01R 31/3842* (2019.01); *G01R 31/392* (2019.01)

(58) Field of Classification Search
CPC . G01R 31/367; G01R 31/392; G01R 31/3842
See application file for complete search history.

(56) References Cited

U.S. PATENT DOCUMENTS

| | | | | |
|---|---|---|---|---|
| 7,315,789 | B2 * | 1/2008 | Plett | G01R 31/3842 702/65 |
| 8,937,459 | B2 | 1/2015 | Park et al. | |

(Continued)

FOREIGN PATENT DOCUMENTS

| | | | | |
|---|---|---|---|---|
| CN | 107290678 A | * 10/2017 | | G01R 31/388 |
| CN | 111060822 A | * 4/2020 | | G01R 31/388 |

OTHER PUBLICATIONS

ISA/US "International Search Report for PCT/IN2021/050823", US, Nov. 23, 2021.

*Primary Examiner* — Alexander Satanovsky
*Assistant Examiner* — Sharad Timilsina
(74) *Attorney, Agent, or Firm* — Troutman Pepper Locke LLP; Tim Tingkang Xia, Esq.

(57) ABSTRACT

The present invention relates to a method (200) and system (100) for estimating state of charge and state of health of a battery (10). A first vector (x) and a second vector (0) are initialised. The first vector (x) is estimated and updated by a first state-space filter based first equivalent circuit solver by assuming a fixed value of the second vector (0). the second vector (0) is estimated and updated based on an Electrochemical Model and then by a second state-space filter based second equivalent circuit solver. The updated values of the second vector (0) by the Electrochemical Model and the second state-space filter based equivalent circuit solver are merged. The state of charge is obtained from the updated value of the first vector (x), and the state of the health is obtained from the merged and updated value of the second vector (0).

6 Claims, 8 Drawing Sheets

(56) References Cited

U.S. PATENT DOCUMENTS

| | | | | |
|---|---|---|---|---|
| 10,267,861 | B2 | 4/2019 | Heiries et al. | |
| 10,663,525 | B2 | 5/2020 | Shen et al. | |
| 2009/0048793 | A1* | 2/2009 | Schoch | G01R 31/3842 702/63 |
| 2015/0377974 | A1* | 12/2015 | Choi | G01R 31/367 702/63 |
| 2018/0313904 | A1 | 11/2018 | Heiries et al. | |
| 2022/0163589 | A1* | 5/2022 | Allam | G01R 31/367 |

* cited by examiner

METHOD FOR ESTIMATING STATE OF CHARGE AND STATE OF HEALTH OF A BATTERY AND A SYSTEM THEREOF

FIELD OF THE INVENTION

The present invention relates to estimating state of charge and state of health of a battery.

BACKGROUND OF THE INVENTION

Modern electric vehicles and hybrid electric vehicles typically use electrochemical cells, such as lithium-ion cells, as energy storage units. Plurality of such cells configured in an appropriate series and parallel combination form a battery. Such batteries are typically coupled to a Battery Management System (BMS), with the BMS configured to monitor the cell voltages, current and temperatures, measured using suitable sensors. One of the primary functions of the BMS is to estimate the state of charge (SOC) and state of health (SOH) of the battery and its constituent cells. Another important function of the BMS is to ensure that the battery operates in a predetermined "Safe Operating Area"—such as to avoid conditions of cell overcharge, undercharge, overtemperature etc. Safe operating area of a cell in general imposes upper and lower thresholds on cell operating voltage, temperature, and current flowing through the cell. The battery is said to be operating in "Safe Operating Area" only if every cell is in "Safe Operating Area". Other important functions of a battery management system include balancing the charge among the cells to prolong the battery life and communicating information to other controllers in the vehicle network.

An accurate state of charge prediction is required to determine the remaining energy in the battery and to determine duration for which the battery can be operated based on present load condition. State of charge of a battery also provides a good judgement to the rider to schedule recharge of the battery. While the state of charge of battery is considered as short-term battery parameter, the state of health is considered as a long-term parameter since the battery degradation happens gradually over its lifetime. SOH of a battery is typically characterized by the total charge storage capacity of the battery. Another parameter that is used to characterize SOH is internal impedance of the battery which plays a major role in the available output power of the battery. An accurate health prediction improves the accuracy of SOC estimation since the latter depends on battery model parameters. Health prediction also provides information about degradation of the battery and aids to schedule replacement of the battery.

One of the conventional methods to estimate SOC is to integrate the current passing through the battery over time. However, this method is prone to drifting because of current measurement noise and measurement offset error. Another conventional method to estimate SOC is to leverage the known monotonic relationship between SOC and open circuit cell voltage of the battery. However, this method requires the battery to be in a relaxed condition, with no current flowing through the battery for a substantial amount of time. More accurate SOC and SOH estimation methods leverage an accurate equivalent model of the battery. Two broad categories of battery models are prevalent—the first category is the "Equivalent Circuit Model", which approximates the underlying chemical phenomenon in battery with an equivalent resistor-capacitor network. Examples of Equivalent Circuit models are series resistance model, 1RC equivalent circuit, 2RC equivalent circuit. The second category is the "Electro-Chemical Model" such as DFN (Doyle-Fuller-Newman) model, SPM (Single Particle Model). Electro-Chemical models are computationally intensive because of the underlying complexity in modelling, and are thus not commonly used in practical BMS systems. In general, Equivalent Circuit models are less accurate than Electro-Chemical models but are more suitable for implementation in practical BMS.

Thus, there is a need in the art for a method for estimating state of charge and state of health of a battery which addresses at least the aforementioned problems.

SUMMARY OF THE INVENTION

In one aspect of the invention, the present invention is directed at a method for estimating state of charge and state of health of a battery. The method has the steps: of initialising a first vector and a second vector based on typically known values of voltage, state of charge of the battery, impedance and charge capacity of the battery; estimating and updating the first vector by a first state-space filter based equivalent circuit solver by assuming a fixed value of the second vector; estimating and updating the second vector, fully or partly, based on an Electrochemical Model; estimating and updating the second vector, fully or partly, by a second state-space filter based equivalent circuit solver; merging the updated values of the second vector by the Electrochemical Model and the second state-space filter based equivalent circuit solver; obtaining the state of charge of the battery from the updated value of the first vector, and obtaining the state of the health of the battery from the merged and updated value of the second vector.

In an embodiment of the invention, first vector is a state vector comprising voltage variables and state of charge of the battery.

In another embodiment of the invention, the second vector is a parameter vector comprising impedance elements and charge capacity of the battery.

In a further embodiment of the invention, an equivalent circuit corresponding to the first equivalent circuit solver and the second equivalent circuit solver comprises one or more RC elements having a known estimated impedance, and a voltage source representing the open circuit voltage of the cell.

In a further embodiment of the invention, wherein the open circuit voltage of the cell in the equivalent circuit is a non-linear function of the state of the charge of the cell.

In another embodiment, the first state-space filter is a Kalman filter. In an embodiment, the second state-space filter is a Kalman filter. In an embodiment, the electrochemical model is an electrolyte Enhanced Single Particle Model.

In another aspect, the present invention relates to a system for estimating state of charge and state of health of a battery. The system has a voltage sensing circuitry for sensing the voltage across cells of the battery; and a current sensing circuitry for sensing the current passing through cells of the battery. The system further has a central processing unit configured for initialising a first vector and a second vector based on typically known values of voltage, state of charge of the battery, impedance and charge capacity of the battery, estimating and updating the first vector by a first state-space filter based equivalent circuit solver by assuming a fixed value of the second vector, estimating and updating the second vector, fully or partly, based on an Electrochemical Model, estimating and updating the second vector, fully or partly, by a second state-space filter based equivalent circuit solver, merging the updated values of the second vector by the Electrochemical Model and the second state-space filter based equivalent circuit solver, and obtaining the state of charge of the battery from the updated value of the first vector, and obtaining the state of the health of the battery from the merged and updated value of the second vector.

In an embodiment of the invention, first vector is a state vector comprising voltage variables and state of charge of the battery.

In another embodiment of the invention, the second vector is a parameter vector comprising impedance elements and charge capacity of the battery.

In a further embodiment of the invention, an equivalent circuit corresponding to the first equivalent circuit solver and the second equivalent circuit solver comprises one or more RC elements having a known estimated impedance, and a voltage source representing the open circuit voltage of the cell.

In a further embodiment of the invention, wherein the open circuit voltage of the cell in the equivalent circuit is a non-linear function of the state of the charge of the cell.

In another embodiment, the first state-space filter is a Kalman filter. In an embodiment, the second state-space filter is a Kalman filter. In an embodiment, the electrochemical model is an electrolyte Enhanced Single Particle Model.

BRIEF DESCRIPTION OF THE DRAWINGS

Reference will be made to embodiments of the invention, examples of which may be illustrated in accompanying figures. These figures are intended to be illustrative, not limiting. Although the invention is generally described in context of these embodiments, it should be understood that it is not intended to limit the scope of the invention to these particular embodiments.

DETAILED DESCRIPTION OF THE INVENTION

The present invention relates to a method and system for estimating state of charge and state of health of a battery. More particularly, the present invention relates to a method and system for estimating state of charge and state of health of a battery, wherein the battery comprises of one or more electrochemical cells.

Figure 1:
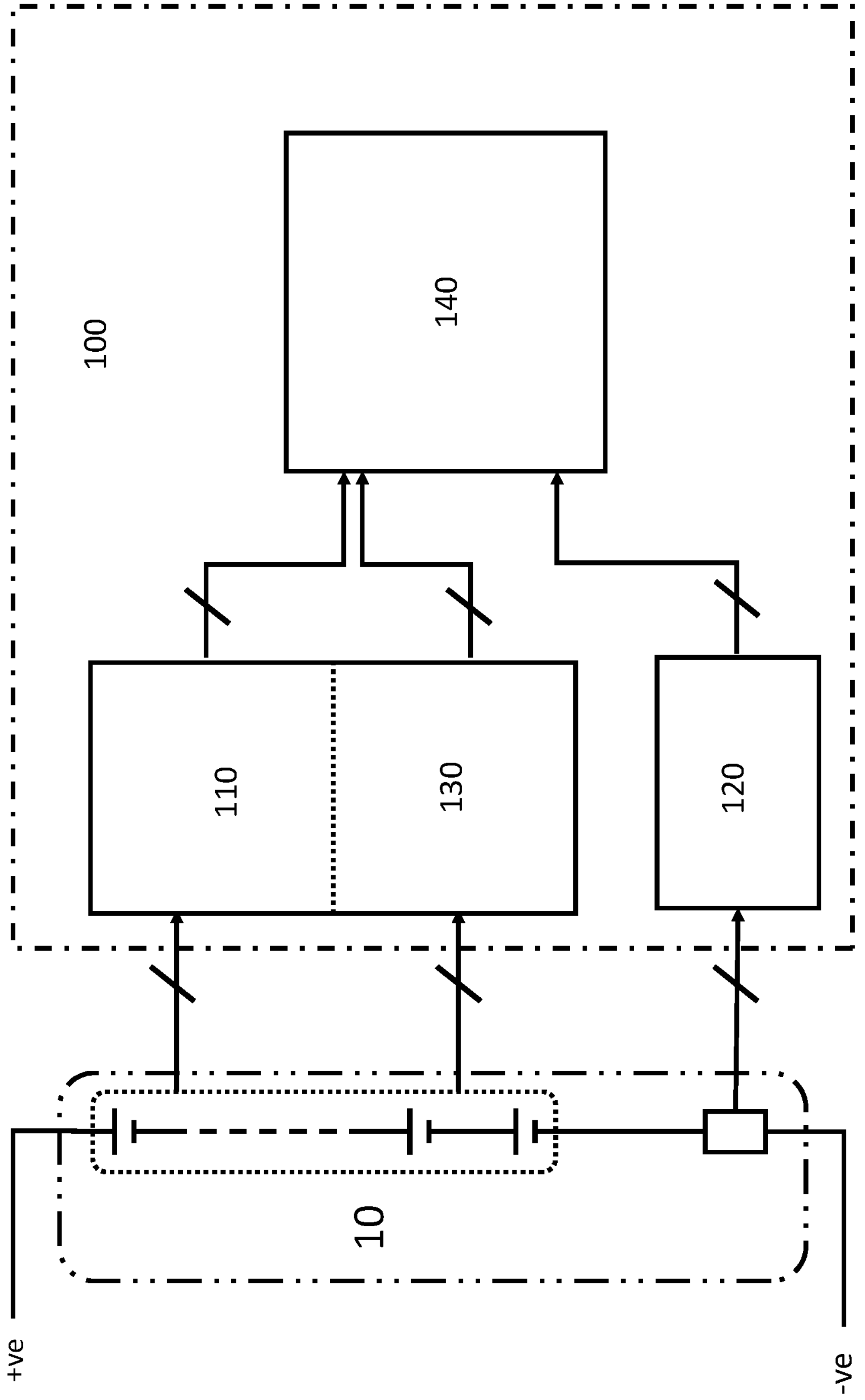
FIG. 1 illustrates a system for estimating state of charge and state of health of a battery, in accordance with an embodiment of the invention.

FIG. 1 illustrates a system 100 for estimation of state of charge and state of health of a battery 10. The system comprises of a battery pack 10 having one or more cell stacks, a current sensing circuitry 120 for sensing the current passing through cells of the battery 10, a voltage sensing circuitry 110 for sensing the voltage across cells of the battery 10. In an embodiment, each cell stack comprises of a set of cells suitably connected in series and parallel combination. In an embodiment, a cell stack also comprises one or more temperature sensors to get a thermal map of the battery. In the system, the current sensing circuitry 120, the voltage sensing circuitry 110 and a temperature sensing circuitry 130 are coupled to the cell stack and a central processing unit 140.

In an embodiment, measurement of voltage, current and temperature data of the battery 10 is sampled periodically using the relevant sensors integrated into the battery 10. The voltage sensing circuitry 110 is connected to cell terminals to sample cell voltages and the temperature sense circuitry 130 is connected to temperature sensors of the cell stack to sample the temperature data. The current sensing circuitry 120 is configured to sample the current data using current sensors in the battery 10. The central processing unit 140 is configured to estimate the state of charge (SOC) and (SOH) of the cells in the battery 10 as explained hereinbelow.

Figure 2:
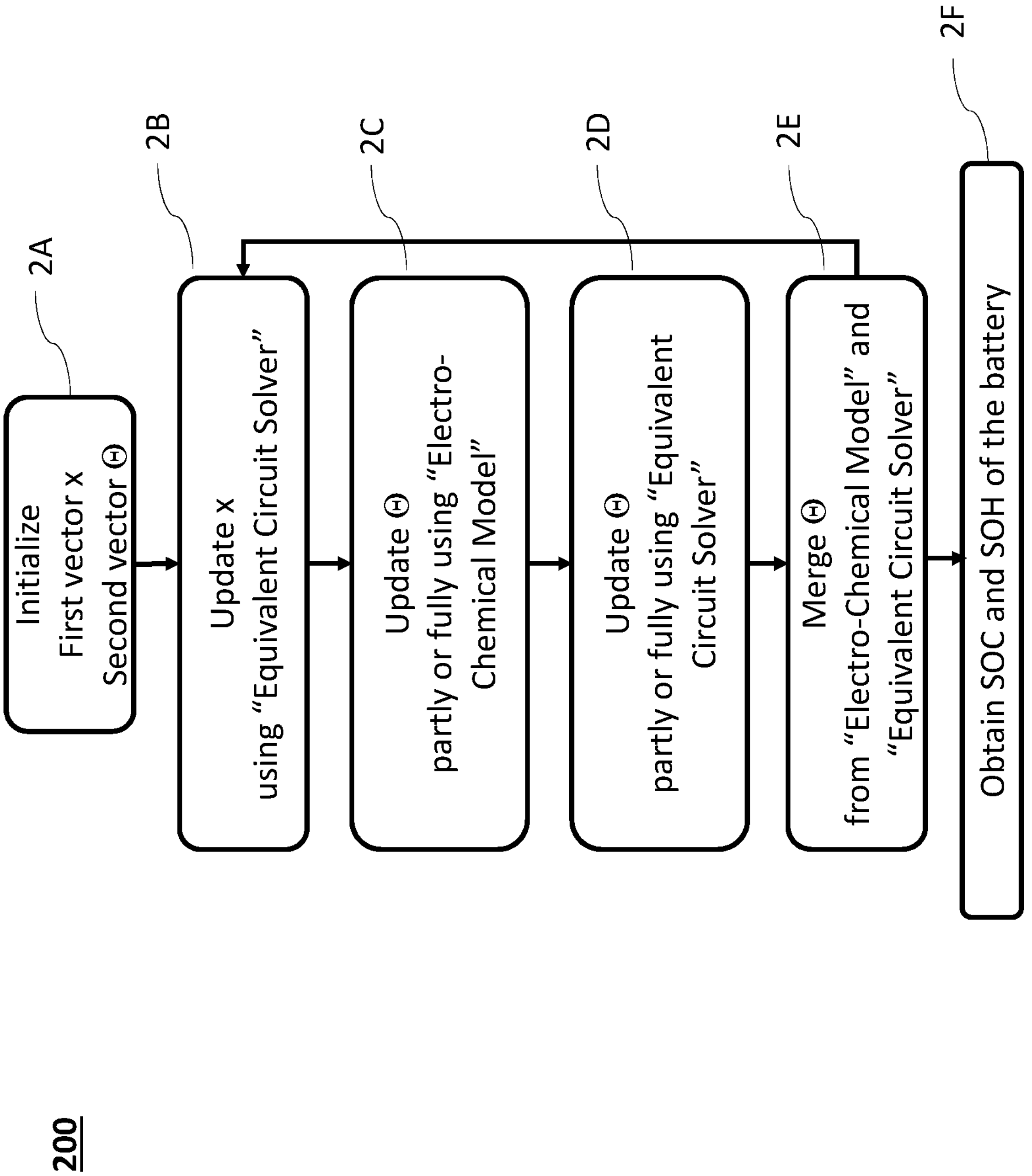
FIG. 2 illustrates a method for estimating state of charge and state of health of a battery, in accordance with an embodiment of the invention.

FIG. 2 illustrates the method steps involved in a method 200 for estimating state of charge and state of health of the battery 10. At step 2A, a first vector (x) and a second vector (Θ) are initialised, based on typically known values of voltage, state of charge of the battery, impedance and charge capacity (Q) of the battery. In an embodiment, the first vector (x) is a state vector comprising voltage variables and state of charge of the battery 10. In another embodiment, the second vector (Θ) is a parameter vector comprising impedance elements and charge capacity (Q) of the battery.

Figure 3:
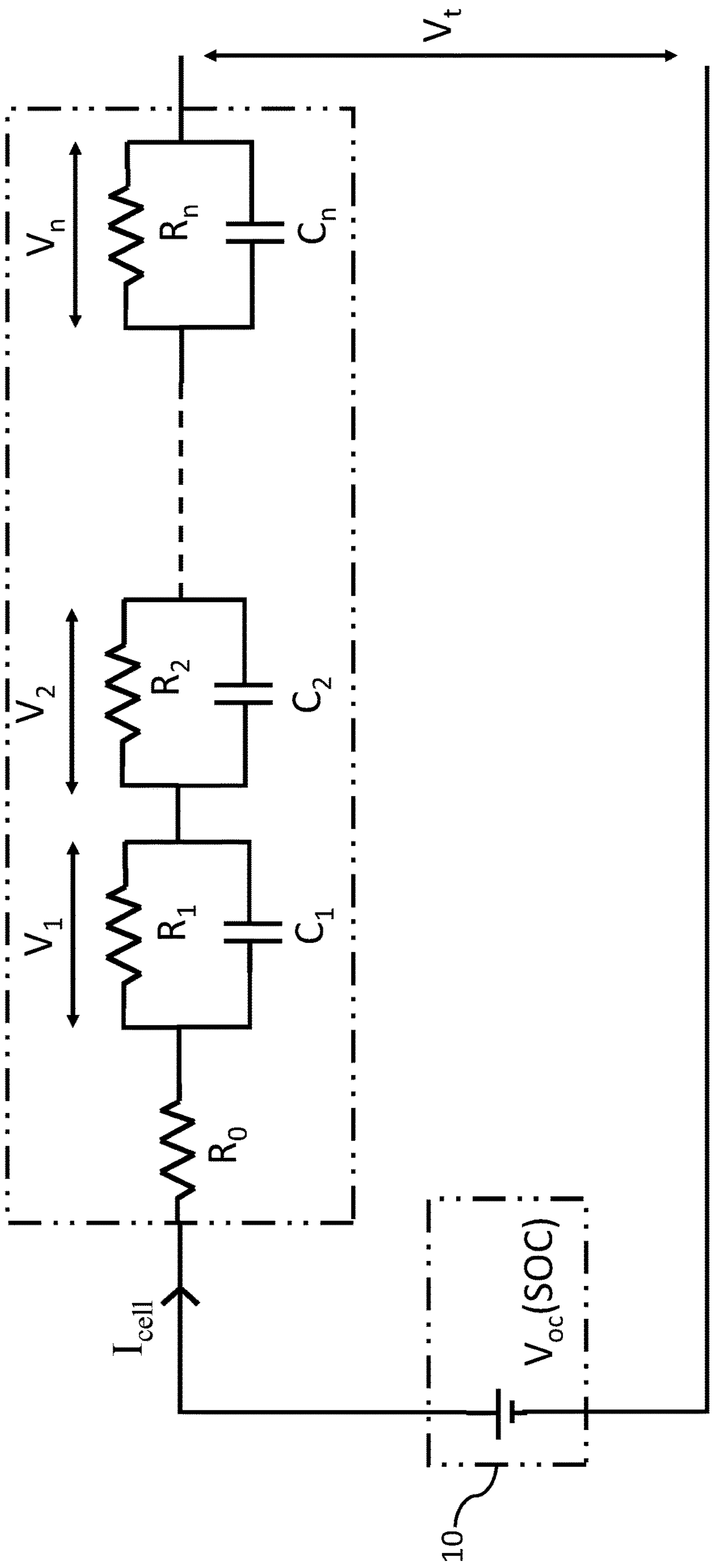
FIG. 3 illustrates an equivalent circuit solver, in accordance with an embodiment of the invention.

At step 2B, the first vector (x) is estimated and updated by a first state-space filter based equivalent circuit solver by assuming a fixed value of the second vector (Θ). FIG. 3 illustrates the underlying first equivalent circuit solver in the present invention. The first equivalent circuit solver comprises one or more RC elements having a known estimated impedance, and a voltage source representing the open circuit voltage of the cell. The impedance of the RC elements is estimated by a second state-space filter based equivalent circuit solver as explained further. It is understood that the voltage across the source ($V_{oc}$) is a nonlinear function of state of charge where SOC is in turn a function of current '$I_{cell}$' and charge capacity (Q). The impedance of the equivalent circuit solver comprises of a plurality of resistance and capacitance (RC) elements. The current $I_{cell}$ and terminal voltage $V_t$ depends on the load connected to the cell terminals and both the variables are measured using the current sensing circuitry 120 and the voltage sensing circuitry 110 as shown in FIG. 1.

As explained above, the present invention categorizes the variables associated with equivalent circuit solver as illustrated in FIG. 3, into the state vector (x) and the parameter vector (Θ). As explained above, in an embodiment, the state vector (x) captures the relatively short-term dynamics in the cell, while the parameter vector (Θ) captures the relatively long-term dynamics in the cell. As an example, state vector 'x' is composed of voltage variables $V_1$ to $V_n$ and SOC and parameter vector is composed of impedance elements $R_0$, $R_1$ to $R_n$, $C_1$ to $C_n$ and charge capacity Q.

At step 2C, the second vector (Θ) is estimated and updated, fully or partly, based on an Electrochemical Model. At step 2D, the second vector (Θ) is estimated and updated, fully or partly, by a second state-space filter based equivalent circuit solver, which captures the long term effect of load on impedance.

Figure 5:
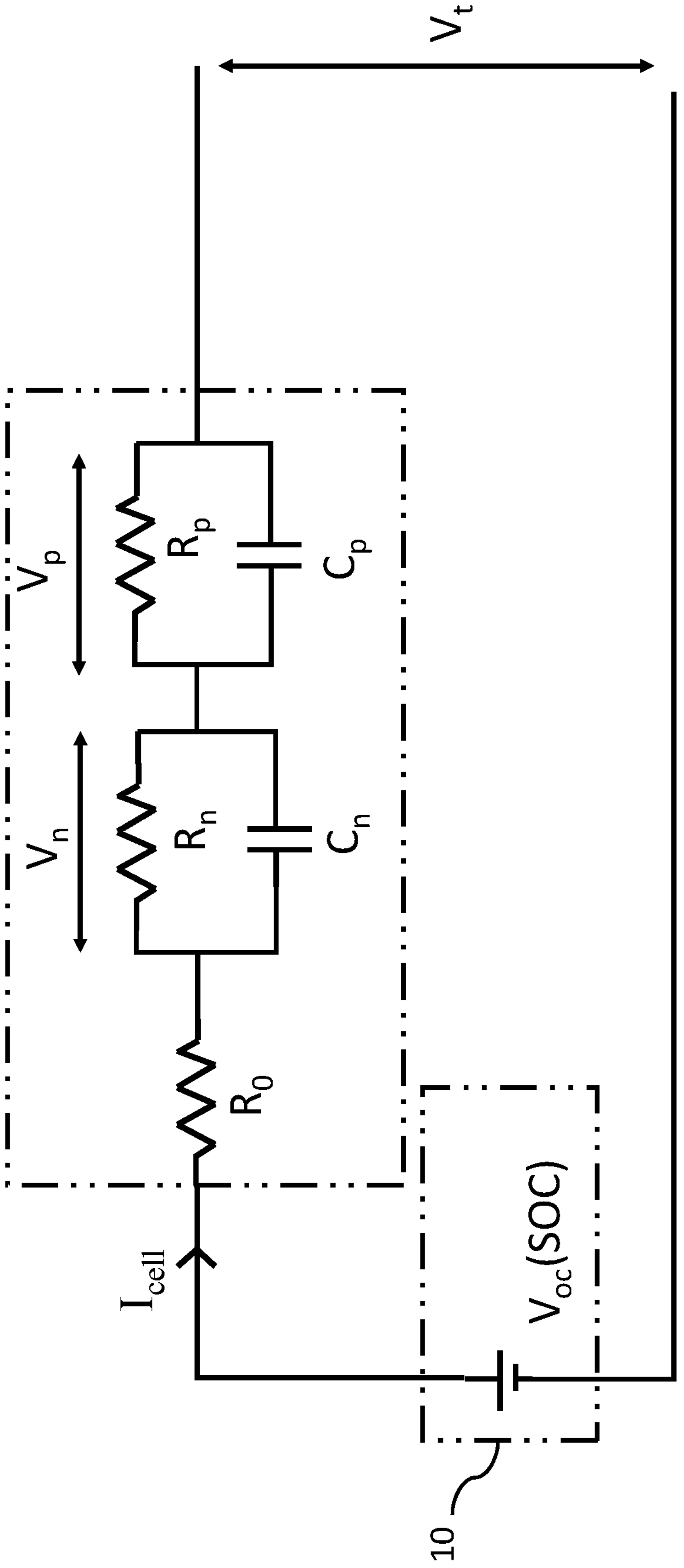
FIG. 5 illustrates a 2RC equivalent circuit for the equivalent circuit solver, in accordance with an embodiment of the invention.

Reference in made to FIG. 5 wherein, in the embodiment illustrated, a 2RC equivalent circuit solver of an electrochemical cell (such as lithium-ion cell) where the number of RC components of impedance in FIG. 3 is two. Voltage across source indicates the open circuit voltage ($V_{oc}$) of the cell which is a direct indication of amount of charge present in the cell. The open circuit voltage is represented by $V_{oc}$, and is a nonlinear function of state of charge. Impedance is characterized by a DC impedance $R_0$ and two AC impedance components in series. Each AC component is a parallel combination of a resistance R and capacitance C.

The $V_n$ and $V_p$ in FIG. 5 are the voltage drops across the respective RC components. The discharge current 'cell' in the FIG. 5 depicts the direction of flow of current when the circuit terminals are connected to a load.

The voltage and current relation is:

$$V_t = V_{oc}(SOC) - I_{cell} * R_0 - V_n - V_p$$

where $V_{oc}$(SOC) is a predetermined function characteristic of cell chemistry and the expressions for SOC, $V_n$, $V_p$ are $$SOC = \frac{\int I_{cell}}{Q}.$$

where Q is the charge storage capacity of the cell.

$$\dot{V}_n = \frac{I_{cell}}{C_n} - \frac{V_n}{R_n C_n}$$

$$\dot{V}_p = \frac{I_{cell}}{C_p} - \frac{V_p}{R_p C_p}$$

This embodiment of the present invention uses the above described 2RC equivalent circuit as the underlying circuit for the equivalent circuit solver.

The state vector 'x' of the first state-space filter is composed of SOC, $V_n$, $V_p$. Variables $V_t$, $I_{cell}$ can be acquired using the current sensing circuitry 120 and the voltage sensing circuitry 110. The other parameters $R_0$, $R_p$, $R_n$, $C_p$, $C_n$, Q are the cell parameters that emulate the internal chemical structure and are constituted into parameter vector 'Θ'. Input variables such as $I_{cell}$ are constituted into input vector 'U'.

Figure 4:
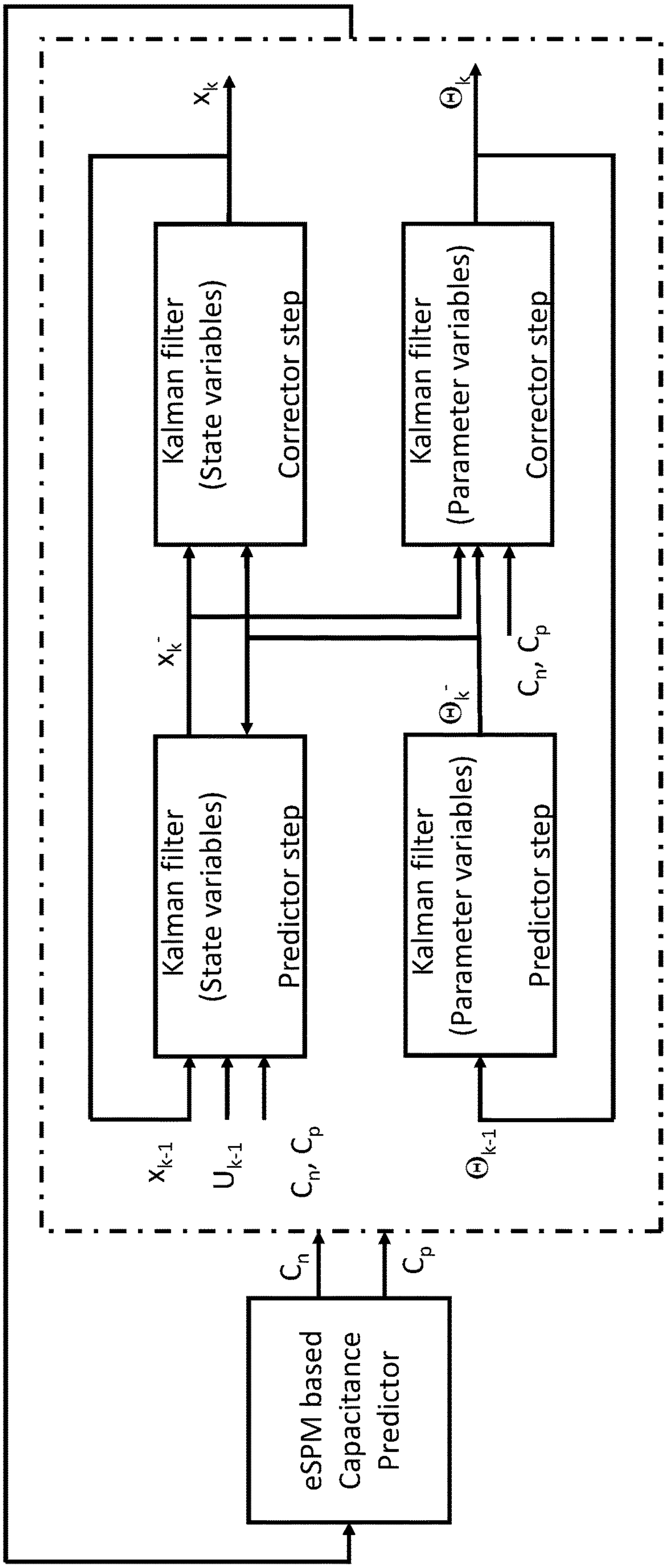
FIG. 4 illustrates Kalman filter based second vector estimation and eSPM based second vector estimation, with Kalman filter based first vector estimation, in accordance with an embodiment of the invention.

In an embodiment, as referenced in FIG. 4, the first state space filter for the equivalent circuit solver and the second state space solver for the equivalent circuit solver is a Kalman Filter. The block level architecture illustrated in FIG. 4 illustrates the state-space filters. The first equivalent circuit solver and the second equivalent circuit solver use a Kalman filter which assumes an ageing model such as "Null model" which are known, to predict the cell parameters. In an embodiment, the Kalman filter can be further realized as a Predictor step and a Corrector step. Both the Kalman filters are capable of exchanging information to provide an optimal output.

Figure 6:
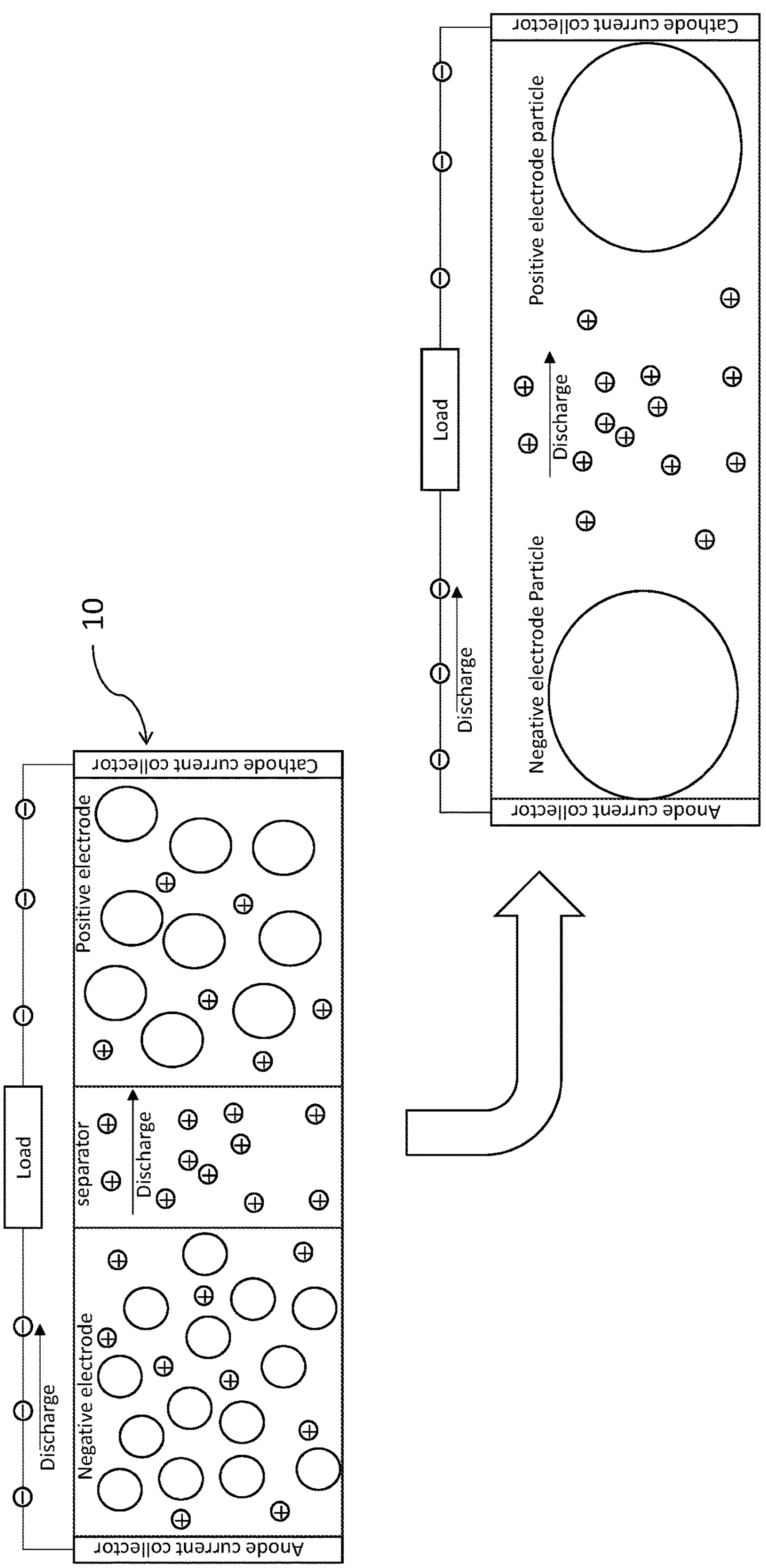
FIG. 6 illustrates an internal structure of an electrochemical cell and its eSPM equivalent structure, in accordance with an embodiment of the invention.

Reference is made to FIG. 4 and FIG. 6, wherein in an embodiment, the Electrochemical Model referred to in step 2D for estimation and updating of the second vector, is an electrolyte Enhanced Single Particle Model (eSPM). As illustrated in FIG. 6, the internal cell structure for an electrolyte Enhanced Single Particle Model, contains a porous negative electrode and a porous positive electrode filled with electrolyte to facilitate positive charge-carrier (eg. lithium ions) mobility. The electrodes are separated using a separator to prevent the flow of electrons while allowing mobility of the positive charge-carriers. The external closed electric circuit with a load facilitates the flow of electrons thus creating a current flow. Each electrode is directly connected to current collectors of high conductivity for electron mobility.

The eSPM equivalent of the cell structure assumes a single spherical structure of electrodes with equivalent concentrations as that of the actual cell. This reduces the structural complexity without significantly compromising on the cell dynamic modelling. The eSPM model also eliminates the separator which has an almost passive role in the ion movement. Electrode current collectors are retained as they are integral for electron movement.

Figure 7:
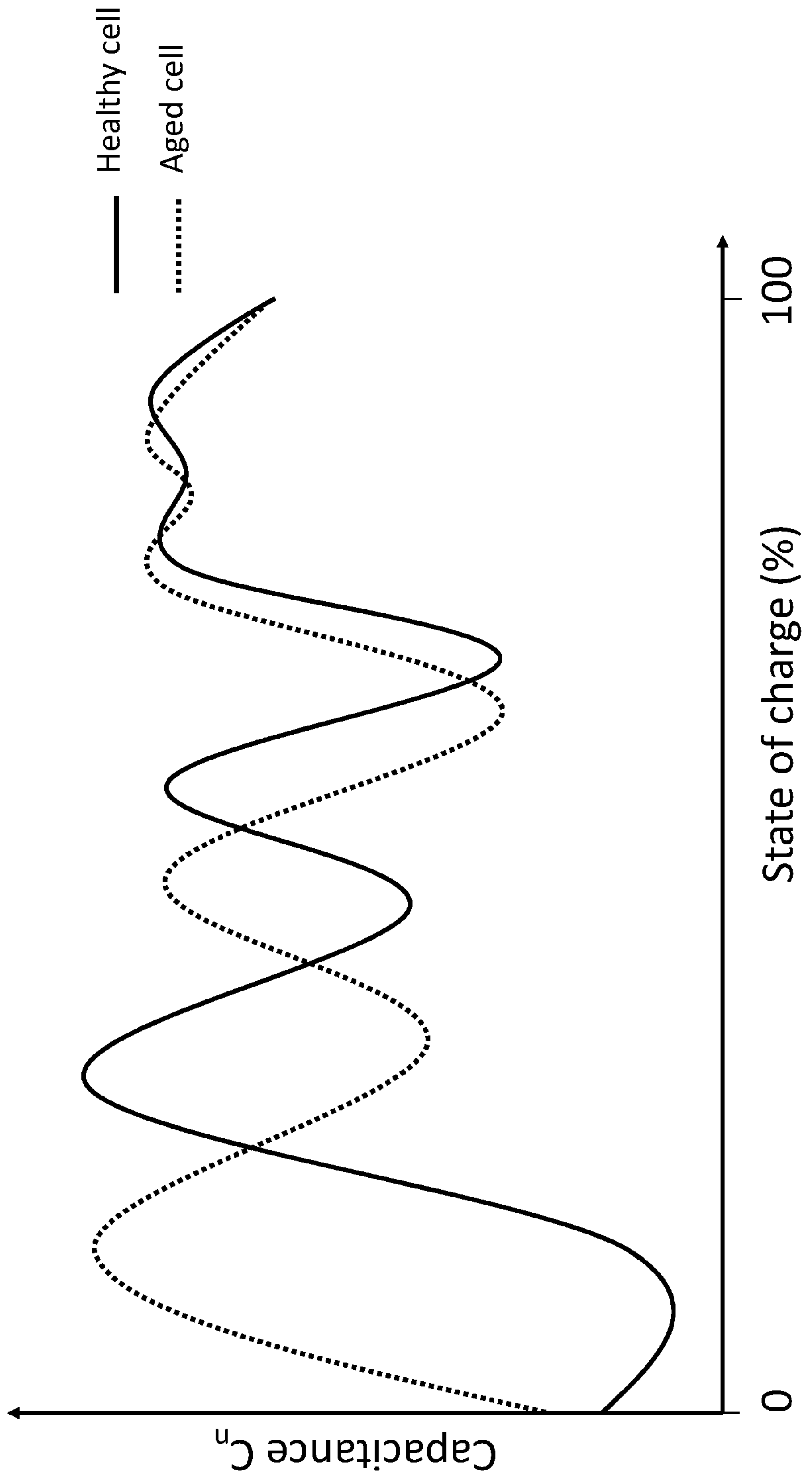
FIG. 7 illustrates a plot of capacitance associated with negative electrode, considering a 2RC model a cell, in accordance with an embodiment of the invention.
Figure 8:
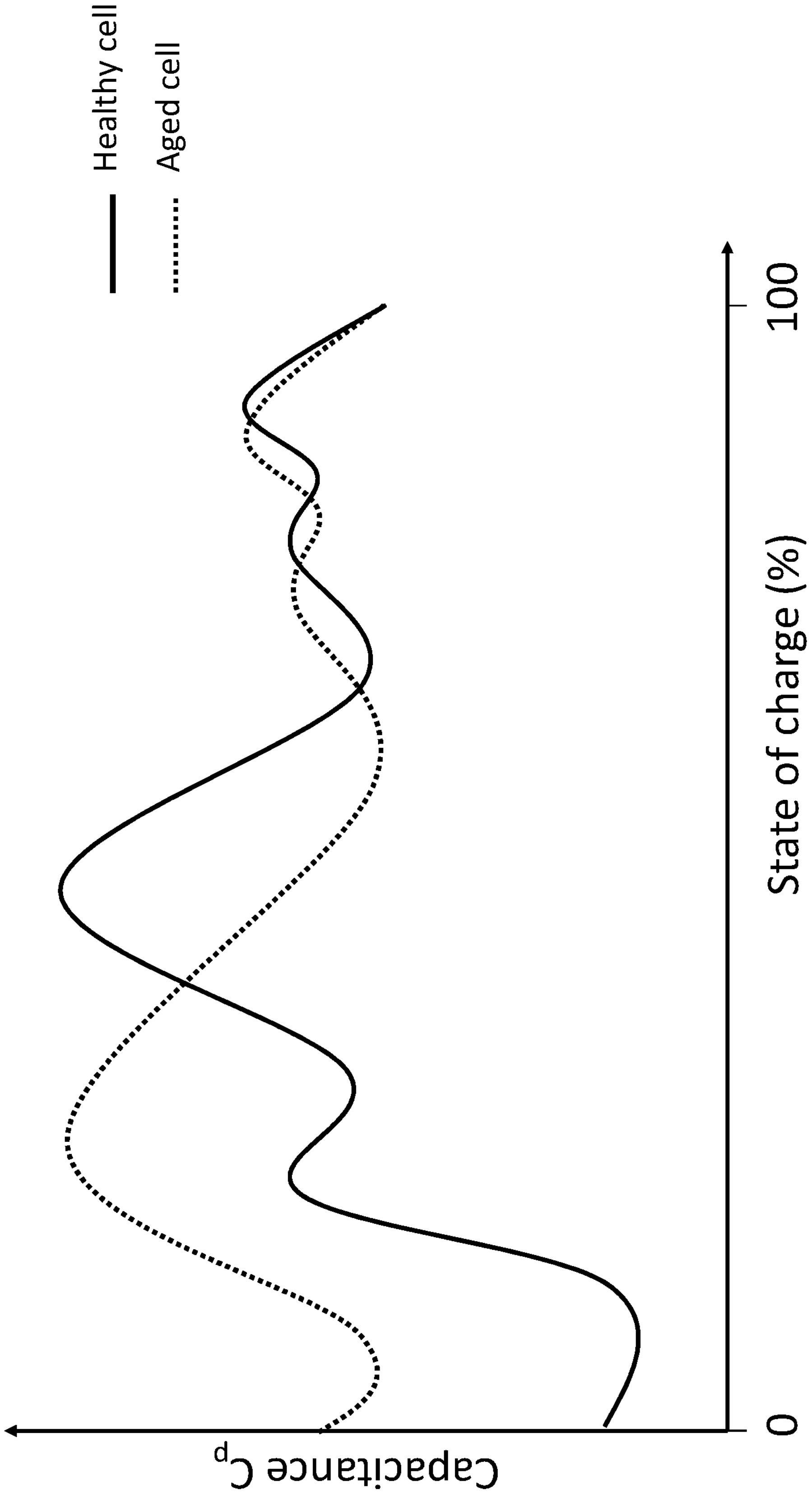
FIG. 8 illustrates a plot of capacitance associated with positive electrode, considering a 2RC model a cell, in accordance with an embodiment of the invention.

The electrode particle impedance can be approximated to a parallel RC network as shown in FIG. 5. $R_n$, $C_n$, component denotes the negative electrode impedance and $R_p$, $C_p$ that of the positive electrode. The resistance of both the current collectors combined relates to $R_0$. The Electrochemical Model based on eSPM model estimates the $C_n$, $C_p$ parameters as a function of variables comprising SOC and charge capacity Q. This uses internal cell diffusion concept which drives the flow of positive charge-carriers (eg. lithium ions) between the single particle electrodes. FIG. 7 depicts a typical plot of $C_n$ as a function of SOC and FIG. 8 depicts a typical plot of $C_p$ as a function of SOC. Both the plots show variation as the charge capacity (Q) of the cell keeps deteriorating as the cell keeps ageing. Updating 'Θ' based on the eSPM model predicts the $C_n$, $C_p$ values based on the input SOC and 'Θ' parameter.

At step 2E, the updated values of the second vector (Θ) by the Electrochemical Model and the second state-space filter based equivalent circuit solver as explained above are merged to result in a more accurate estimation of second vector (Θ). Finally at step 2F, the state of charge of the battery is obtained from the updated value of the first vector (x), and the state of the health of the battery is obtained from the merged and updated value of the second vector (Θ), as explained above.

Advantageously, the present invention provides a method for estimation of state of charge and state of health of the battery which benefits from the simplicity of equivalent circuit models, while also benefiting from the accuracy of Electrochemical models.

Further, the system and method of the present invention are capable of being integrated in a battery management system for an electric or a hybrid vehicle, thereby providing a system for estimation of state of charge and state of health of a battery, which is not only highly accurate, but is also less computationally intensive. An accurate prediction of state of charge of a battery indicates to the user as to when the battery needs to be charged and the range of the electric vehicle, and the accurate prediction of state of health of a battery indicates to the user as to when the battery needs to be replaced.

While the present invention has been described with respect to certain embodiments, it will be apparent to those skilled in the art that various changes and modification may be made without departing from the scope of the invention as defined in the following claims.

The invention claimed is:

1. A method (200) for operating a battery (10) within a safe operating area by accurately estimating state of charge and state of health in a battery management system (100) comprising a voltage sensing circuitry (110), a current sensing circuitry (120) and a central processing unit (CPU) (140), the method comprising the steps of:

receiving, by the CPU (140) via the voltage sensing circuitry (110) and the current sensing circuitry (120), real-time measurements of voltages across cells of the battery (10) and currents passing through cells of the battery (10);

initializing, by the CPU (140), a first vector (x) and a second vector (Θ) based on initial known values of voltage, state of charge of the battery, impedance and charge capacity (Q) of the battery (10);

estimating and updating, by the CPU (140), the first vector (x) using a first Kalman filter based on a first equivalent circuit solver, wherein the first vector (x) is a state vector comprising voltage variables and the state of charge of the battery (10), and wherein the second vector (Θ) is assumed to be fixed during this estimation;

estimating and updating, by the CPU (140), the second vector (Θ), wherein the second vector (Θ) is a parameter vector comprising impedance elements and charge capacity (Q) of the battery (10), by performing both of the following concurrently:

a first estimation based on an electrolyte Enhanced Single Particle Model (eSPM), wherein the eSPM estimates capacitance parameters of the impedance elements as a function of the state of charge and the charge capacity using internal cell diffusion of single particle electrodes; and a second estimation using a second Kalman filter based on a second equivalent circuit solver;

merging, by the CPU (140), the updated values of the second vector (Θ) obtained from the eSPM model and the second Kalman filter to generate a merged parameter vector;

obtaining, by the CPU (140), the state of charge of the battery (10) from the updated value of the first vector (x), and obtaining the state of the health of the battery (10) from the merged parameter vector; and outputting, by the CPU (140), an indication of at least one of a remaining range of an electric vehicle comprising the battery, a need to recharge the battery, and a need to replace the battery, based on the obtained state of charge and state of health of the battery.

2. The method (200) as claimed in claim 1, wherein an equivalent circuit corresponding to the first equivalent circuit solver and the second equivalent circuit solver comprises one or more RC elements having a known estimated impedance, and a voltage source representing the open circuit voltage ($V_{oc}$) of a cell.

3. The method (200) as claimed in claim 2, wherein the open circuit voltage ($V_{oc}$) of the cell in the equivalent circuit is a non-linear function of the state of the charge of the cell.

4. A battery management system (100) for maintaining a battery (10) within a safe operating area, comprising:

a voltage sensing circuitry (110) configured to sense a voltage across cells of the battery (10);

a current sensing circuitry (120) configured to sense a current passing through cells of the battery (10); and a central processing unit (CPU) (140) communicatively coupled to the voltage sensing circuitry (110) and the current sensing circuitry (120), wherein the CPU (140) is configured to:

initialize a first vector (x) and a second vector (Θ) based on initial known values of voltage, state of charge, impedance, and charge capacity (Q) of the battery (10);

estimate and update the first vector (x) using a first Kalman filter based on a first equivalent circuit solver, wherein the first vector (x) is a state vector comprising voltage variables and a state of charge of the battery (10), and wherein the second vector (Θ) is assumed to be fixed during this estimation;

estimate and update the second vector (Θ), wherein the second vector (Θ) is a parameter vector comprising impedance elements and charge capacity (Q) of the battery (10), by performing both of the following concurrently:

a first estimation based on an electrolyte Enhanced Single Particle Model (eSPM), wherein the eSPM estimates capacitance parameters of the impedance elements as a function of the state of charge and the charge capacity using internal cell diffusion of single particle electrodes; and a second estimation using a second Kalman filter based on a second equivalent circuit solver;

merge the updated values of the second vector (Θ) obtained from the eSPM model and the second Kalman filter to generate a merged parameter vector;

obtain the state of charge of the battery (10) from the updated value of the first vector (x), and obtain the state of health of the battery (10) from the merged parameter vector; and output an indication of at least one of a remaining range of an electric vehicle comprising the battery, a need to recharge the battery, and a need to replace the battery, based on the obtained state of charge and state of health of the battery.

5. The system (100) as claimed in claim 4, wherein an equivalent circuit corresponding to the first equivalent circuit solver and the second equivalent circuit solver comprises one or more RC elements having a known estimated impedance, and a voltage source representing the open circuit voltage ($V_{oc}$) of a cell.

6. The system (100) as claimed in claim 5, wherein the open circuit voltage ($V_{oc}$) of the cell in the equivalent circuit is a non-linear function of the state of the charge of the cell.

* * * * *